United States Patent
Sakai

(10) Patent No.: US 10,043,786 B2
(45) Date of Patent: Aug. 7, 2018

(54) COMPOSITE PROTECTION CIRCUIT, COMPOSITE PROTECTION ELEMENT, AND LED DEVICE FOR ILLUMINATION

(71) Applicant: Murata Manufacturing Co., Ltd., Nagaokakyo-shi, Kyoto-fu (JP)

(72) Inventor: Nobuo Sakai, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 0 days.

(21) Appl. No.: 15/134,607

(22) Filed: Apr. 21, 2016

(65) Prior Publication Data
US 2016/0233201 A1   Aug. 11, 2016

Related U.S. Application Data

(63) Continuation of application No. PCT/JP2014/077895, filed on Oct. 21, 2014.

(30) Foreign Application Priority Data

Oct. 24, 2013  (JP) .................... 2013-220738

(51) Int. Cl.
*H01L 25/16* (2006.01)
*H05B 33/08* (2006.01)
(Continued)

(52) U.S. Cl.
CPC ........ *H01L 25/167* (2013.01); *H01L 23/5252* (2013.01); *H01L 27/0248* (2013.01);
(Continued)

(58) Field of Classification Search
CPC . H01L 2224/48091; H01L 2224/48247; H01L 2924/00014; H01L 23/5252;
(Continued)

(56) References Cited

U.S. PATENT DOCUMENTS 5,341,267 A * 8/1994 Whitten .................. H01L 23/60
257/530
5,369,054 A * 11/1994 Yen ..................... H01L 23/5252
257/355
(Continued)

FOREIGN PATENT DOCUMENTS

DE    102005008100 A1 *  8/2006    ......... H01S 5/06825
JP        11251644 A        9/1999
(Continued)

OTHER PUBLICATIONS

International Search Report issued for PCT/JP2014/077895 dated Jan. 20, 2015.
(Continued)

*Primary Examiner* — Michelle Mandala
(74) *Attorney, Agent, or Firm* — Arent Fox LLP

(57) ABSTRACT

A Zener diode used as an ESD protection element is connected in parallel to a circuit to be protected, for example an LED chip. The Zener diode is connected in parallel to an antifuse element. For example, an LED package (P1-Pn) includes the LED chip and a composite protection element connected in parallel thereto. The composite protection element includes the Zener diode and antifuse element. The Zener diode is formed in a semiconductor substrate, and the antifuse element is formed in a wiring layer on the semiconductor substrate.

14 Claims, 12 Drawing Sheets

(51) Int. Cl.
   *H01L 23/525*   (2006.01)
   *H01L 27/02*    (2006.01)
   *H01L 29/866*   (2006.01)
   *H01L 33/62*    (2010.01)

(52) U.S. Cl.
   CPC ........ *H01L 27/0255* (2013.01); *H01L 29/866* (2013.01); *H01L 33/62* (2013.01); *H05B 33/089* (2013.01); *H01L 2224/48091* (2013.01); *H01L 2224/48247* (2013.01); *Y02B 20/341* (2013.01)

(58) Field of Classification Search
   CPC ... H01L 23/5256; H01L 23/62; H01L 25/167; H01L 27/0248; H01L 27/0255; H01L 29/866; H01L 33/62; H05B 33/089; Y02B 20/341
   USPC ................. 257/529, 530, E23.147, E23.149
   See application file for complete search history.

(56) References Cited

U.S. PATENT DOCUMENTS

| | | | |
|---|---|---|---|
| 5,798,475 A * | 8/1998 | Reynes | F42B 3/13 102/202.5 |
| 5,859,772 A * | 1/1999 | Hilpert | H02H 7/1227 327/405 |
| 6,199,484 B1 * | 3/2001 | Martinez-Tovar | F42B 3/18 102/202.4 |
| 6,331,763 B1 * | 12/2001 | Thomas | H02H 9/042 320/136 |
| 8,242,531 B2 | 8/2012 | Chen | |
| 8,497,523 B2 | 7/2013 | Chen | |
| 8,779,676 B2 * | 7/2014 | Simi | H05B 33/0815 315/219 |
| 9,025,350 B2 * | 5/2015 | Gan | H02M 7/49 361/18 |
| 2005/0140345 A1 * | 6/2005 | Iwabuki | H05B 33/0893 323/268 |
| 2010/0213496 A1 | 8/2010 | Chen | |
| 2011/0057569 A1 * | 3/2011 | Wei | H05B 33/083 315/122 |
| 2011/0309472 A1 | 12/2011 | Nakaiso et al. | |
| 2012/0273833 A1 | 11/2012 | Chen | |
| 2012/0306528 A1 * | 12/2012 | Heinisch | H01L 22/14 324/762.08 |

FOREIGN PATENT DOCUMENTS

| | | |
|---|---|---|
| JP | 2007200577 A | 8/2007 |
| JP | 2010212679 A | 9/2010 |
| JP | 2011124333 A | 6/2011 |
| JP | 2012169403 A | 9/2012 |
| WO | WO 2010100995 A1 | 9/2010 |
| WO | WO 2011/122182 A1 | 10/2011 |

OTHER PUBLICATIONS

Written Opinion of International Searching Authority issued for PCT/JP2014/077895, dated Jan. 20, 2015.

* cited by examiner

COMPOSITE PROTECTION CIRCUIT, COMPOSITE PROTECTION ELEMENT, AND LED DEVICE FOR ILLUMINATION

CROSS REFERENCE

The present application is a continuation of International application No. PCT/JP2014/077895, filed Oct. 21, 2014, which claims priority to Japanese Patent Application No. 2013-220738, filed Oct. 24, 2013, the entire contents of each of which are incorporated herein by reference.

TECHNICAL FIELD

The present invention relates to a composite protection circuit and composite protection element that provide protection against ESD and protection against open failure and to an LED device for illumination including each of them.

BACKGROUND ART

Typical LED chips used for, for example, for illumination have low resistance to electronic discharge (ESD) and may be broken by ESD occurring during transport or the like. One way to reduce this risk is to connect an ESD protection element, such as a Zener diode, in parallel to an LED chip. This is shown, for example in a Japanese Unexamined Patent Application Publication No. 2010-212679.

SUMMARY OF INVENTION

In the structure in which a Zener diode as an ESD protection element is connected in parallel to an LED chip, if the LED chip fails in open mode for some reason, a current flows in the Zener diode. Although the Zener diode is not broken when only an instantaneous large current, such as ESD, flows therein, the Zener diode generates heat and results in a breakdown in a condition where an overcurrent continuously flows therein due to the above-described failure in the LED.

A typical LED illumination apparatus includes a plurality of LED chips connected in series and driven by a constant current. When one of the LED chips fails in open mode it leads to an open-mode failure in the ESD protection element and all the lights in the other LED chips connected in series are turned off. FIGS. 14(a), (b), and (c) are circuit diagrams that illustrate such an example. In FIGS. 14(a), (b), and (c), P1, ..., Pn are LED packages each including an LED chip 1 and a Zener diode 2 as an ESD protection element connected in parallel thereto. These LED packages are connected in series and form circuitry in an LED illumination apparatus. Normally, as illustrated in FIG. 14(a), all the LED chips 1 are energized. If, for example, as illustrated in FIG. 14(B), the LED chip 1 in the LED package P1 fails in open mode, a bypass current flows in the Zener diode 2 connected in parallel to that LED chip 1. This causes heat generation in that Zener diode 2 and it also fails in open mode. As a result, and as illustrated in FIG. 14(c), currents to all the LED chips 1, including the LED chip 1 in the LED package P1, are interrupted and their lights are turned off.

It is a first object of the present invention to provide a composite protection circuit and composite protection element that have the function of providing protection against ESD and that can prevent open-mode failure.

It is a second object of the present invention to provide an LED device for illumination having the function of providing protection against ESD and the current bypass function.

A composite protection circuit in the present invention includes an ESD protection element connected in parallel to a circuit to be protected and an antifuse element connected in parallel to the ESD protection element.

A composite protection element in the present invention includes an ESD protection element connected in parallel to a circuit to be protected and an antifuse element connected in parallel to the ESD protection element. The ESD protection element and the antifuse element are configured on a signal chip.

The chip may preferably be a semiconductor substrate, the ESD protection element may preferably be a Zener diode formed on the semiconductor substrate, and the antifuse element may preferably be formed in a wiring layer on a surface of the semiconductor substrate and may preferably have a multilayer structure in which an insulation layer is disposed between electrode layers.

An LED device for illumination in the present invention includes the above-described composite protection element and the circuit to be protected connected in parallel to the composite protection element. The circuit to be protected is an LED chip for illumination, and the composite protection element and the LED chip for illumination are housed in a single package.

Advantageous Effects of Invention

According to the composite protection circuit and composite protection element in the present invention, the circuit to be protected is protected from ESD, and even if the element for ESD protection fails in open mode, a current path for bypassing the circuit to be protected.

In addition to the circuit to be protected, the antifuse element can also be protected from ESD.

In particular, because the ESD protection element connected in parallel to the circuit to be protected and the antifuse element connected in parallel to the ESD protection element are configured in a single chip, the length of wiring can be shortened, and thus the antifuse element can be protected from ESD. In the case where a composite protection circuit is composed of the ESD protection element and antifuse element, both of which are discrete components, because a resistance component and a parasitic inductance component related to the wiring connecting the elements are large, the resistance of the antifuse element in operation is large, and thus the antifuse element may not be protected from ESD. Configuring the ESD protection element and antifuse element in a single chip can enable the antifuse element to be protected from ESD.

Because the ESD protection element and antifuse element are configured in the single chip, heat of the ESD protection element is conveyed to the antifuse, the antifuse is heated, and thus the antifuse can be efficiently operated.

According to the LED device for illumination in the present invention, it can be protected from ESD during transport, in mounting, or in use after mounting, and in the case where a plurality of LED devices for illumination are connected in series and are used, even if an LED device fails in open mode, a current flows while bypassing it, and the lights in the other LEDs for illumination can be prevented from being turned off.

DESCRIPTION OF EMBODIMENTS

Figure 1:
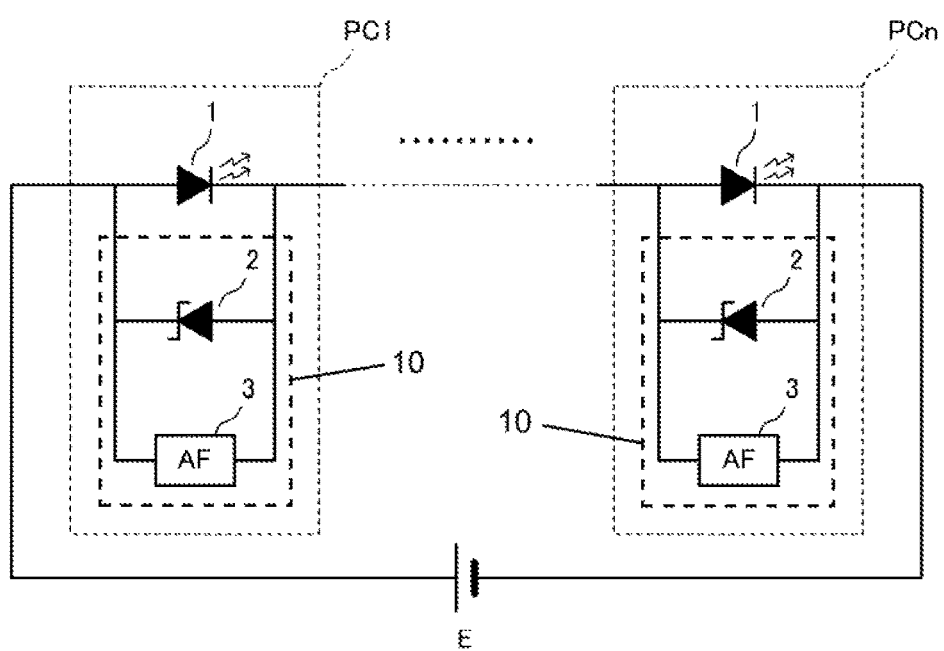
FIG. 1 is a circuit diagram of an LED illumination apparatus according to a first embodiment.

A plurality of forms for implementing the present invention are described below using specific examples with reference to the drawings. In the drawings, like reference numerals indicate like elements. The embodiments are illustrative only, and the configurations illustrated in different embodiments may be replaced or combined in part.

First Embodiment

FIG. 1 is a circuit diagram of an LED illumination apparatus including composite protection circuits according to a first embodiment. The LED illumination apparatus includes parallel circuits PC1 through PCn (n being an integer greater than one) each including an LED chip 1, Zener diode 2, and antifuse element 3. The parallel circuits PC1, . . . , PCn are connected in series with each other. A power supply circuit E for supplying a predetermined current to the series circuit is provided. The LED chip 1 is a "circuit to be protected" as used herein. A composite protection element 10 includes the Zener diode 2 as an ESD protection element and the antifuse element 3 connected in parallel. The structure of the antifuse element 3 is illustrated in a different embodiment below. The antifuse element 3 is an element in which when a voltage exceeding a predetermined value is applied across terminals, the terminals become conductive (shorted).

Figure 2A:
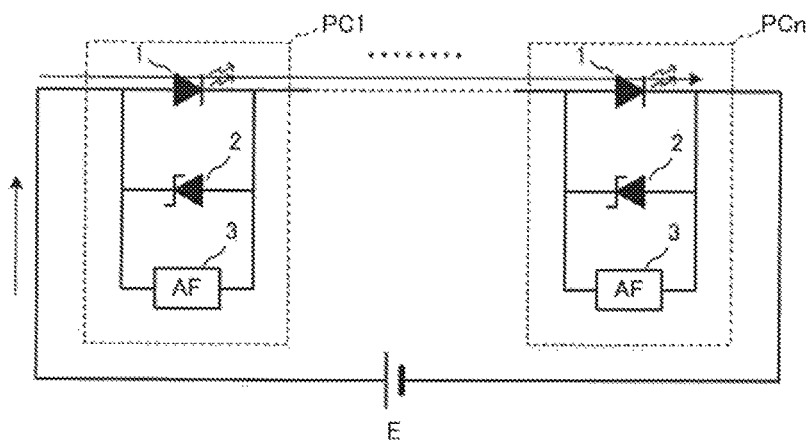
FIGS. 2(a), (b), and (c) illustrate example current paths in the LED illumination apparatus of FIG. 1 in operation.

FIGS. 2(a), (b), and (c) illustrate exemplary current paths in the LED illumination apparatus in operation. When a forward voltage of the LED chip 1 is represented as Vf, a breakdown voltage of the Zener diode 2 is represented as Vbr, and a trigger voltage of the antifuse element 3 is represented as Vtr, normally, Vf<Vbr<Vtr. The power supply circuit E drives all the LED chips 1 such that a current flowing in each of the LED chips 1 is a predetermined forward current If. The voltage across the ends in the LED chip 1 is the above-described voltage Vf. In the case where the power supply circuit E is configured as a constant-voltage power supply circuit, when its power supply voltage is represented as Vdd and the number of LED packages is represented as n, Vdd−(n−1)*Vf>Vtr.

For example, in the case where the LED chip 1 is an LED chip of 1 W, its forward voltage Vf is 3 V when a current of 350 mA flows. The breakdown voltage Vbr of the Zener diode 2 is 8 V. The trigger voltage Vtr of the antifuse element 3 is 20 V, and a voltage drop in an on state is approximately 1 V (3Ω×350 mA).

Normally, as illustrated in FIG. 2(a), a constant current flows in all the LED chips 1, and their lights are turned on.

Figure 2B:
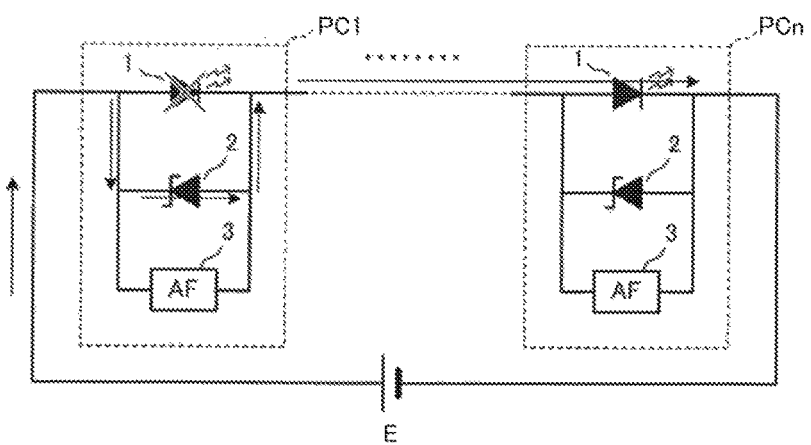
Figure 2C:
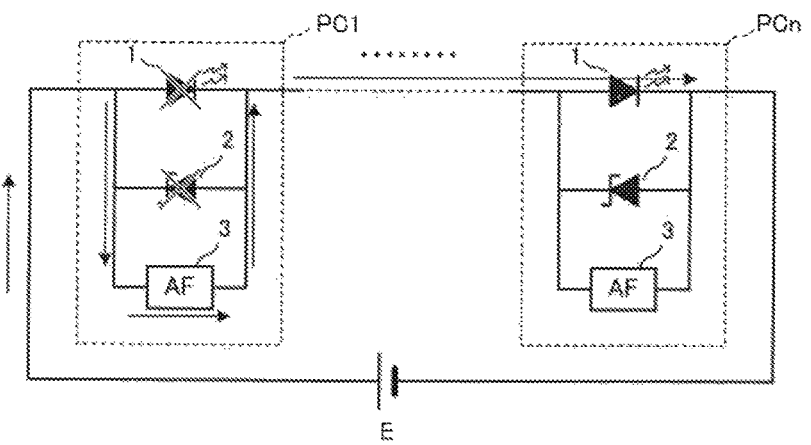

If the LED chip 1 in the parallel circuit PC1 fails in its open mode, the voltage applied to the composite protection element 10 connected in parallel to that LED chip 1 will exceed the breakdown voltage Vbr of the Zener diode 2 and the Zener diode 2 will be turned on. At this time, because Vbr<Vtr, the antifuse element 3 stays open. Accordingly, as illustrated in FIG. 2(b), a bypass current flows in the Zener diode 2.

If the Zener diode 2 in the parallel circuit PC1 subsequently fails in its open mode (e.g., because of its heat generation), the voltage across the ends in the antifuse element 3 in the parallel circuit PC1 will become larger than the trigger voltage Vtr in the antifuse element 3 and the antifuse element 3 will become conductive (shorted). This causes the antifuse element 3 to constitute a bypass circuit enabling energization of the parallel circuits other than the parallel circuit PC1.

Figure 3:
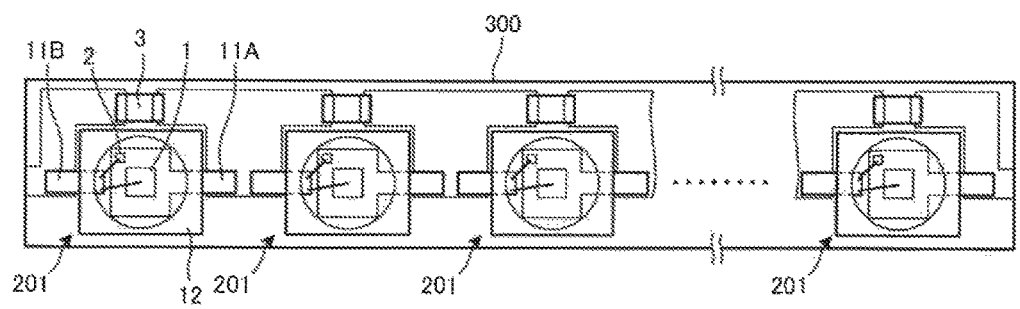
FIG. 3 is a plan view of a circuit board in the LED illumination apparatus according to the first embodiment.

FIG. 3 is a plan view of a circuit board in the above-described LED illumination apparatus. A plurality of LED devices 201 for illumination and a plurality of antifuse elements 3 are mounted on an upper surface of a circuit board 300 in the LED illumination apparatus. FIG. 3 illustrates a state where the covers of the LED devices for illumination have been removed. An alumina package 12 is integral with lead frames 11A and 11B. In a cavity in the alumina package 12, the LED chip 1 and Zener diode chip 2 are attached onto the lead frame 11A preferably by die-bonding. In the cavity in the alumina package 12, the LED chip 1 is attached to the lead frame 11B with a wire interposed therebetween by wire-bonding. Similarly, the Zener diode chip 2 is attached to the lead frame 11B with a wire interposed therebetween by wire-bonding.

The antifuse element 3 is connected to a conductive pattern disposed on the circuit board 300 and thus connected in parallel to the LED device 201. In this way, the LED illumination apparatus including the composite protection circuits illustrated in FIG. 1 is configured.

Second Embodiment

Figure 4:
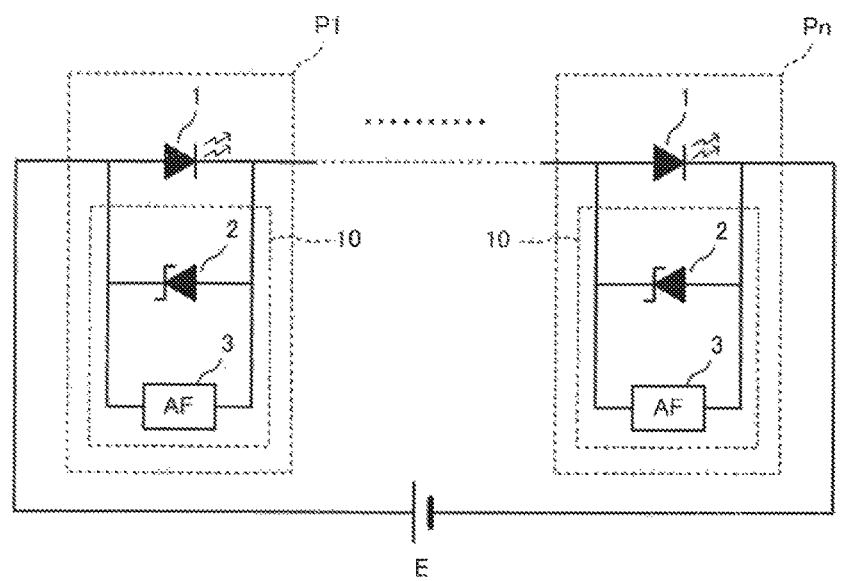
FIG. 4 is a circuit diagram of an LED illumination apparatus including a composite protection element according to a second embodiment.

FIG. 4 is a circuit diagram of an LED illumination apparatus according to a second embodiment. From a circuit standpoint it is identical to the circuit of the first embodiment. However, in this embodiment, and as described further below, the Zener diode and the antifuse elements comprising the composite protection element are formed on a single chip.

The LED illumination apparatus includes the plurality of LED packages P1 through Pn (n being an integer greater than 1) connected in series and the power supply circuit E for supplying a predetermined current to the series circuit. Each of the LED packages P1, ..., Pn includes the LED chip 1 and composite protection element 10 connected in parallel. The LED chip 1 is the "circuit to be protected" as used herein. The composite protection element 10 includes the Zener diode 2 as the ESD protection element and the antifuse element 3 connected in parallel.

Figure 5A:
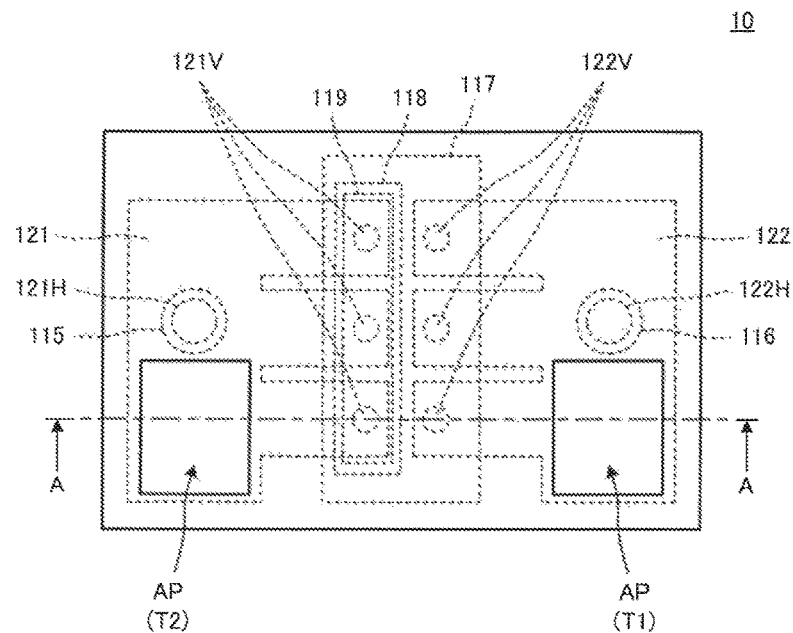
FIG. 5(a) is a plan view of a composite protection element 10.
Figure 5B:
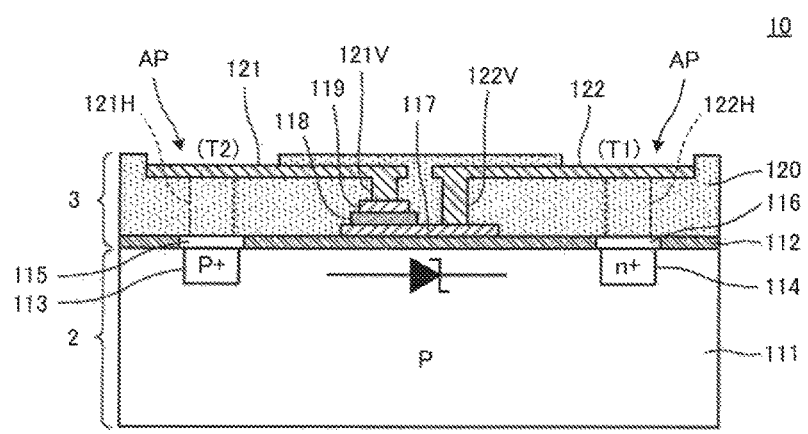
FIG. 5(b) is a cross-sectional view in a section taken along A-A in FIG. 5(a).

FIG. 5(a) is a plan view of a silicon chip on which the composite protection element 10. FIG. 5(b) is a cross-sectional view in a section taken along A-A in FIG. 5(a). The composite protection element 10 is configured on a p-type silicon (Si) substrate (semiconductor substrate) 111.

As illustrated in FIG. 5(b), a silicon dioxide (SiO2) film 112 is formed on a surface of the p-type Si substrate 111. A p+ diffusion region 113 and an n+ diffusion region 114 are formed on the p-type Si substrate 111 through openings in the SiO2 film 112. Aluminum (Al) electrodes 115 and 116 are formed in the openings in the SiO2 film 112. This structure enables the portion between the Al electrodes 115 and 116 to act as a Zener diode.

A lower electrode 117, an insulation layer 118, and an upper electrode 119 are formed in this order on the surface of the SiO2 film 112. A protective film 120 is formed on the surface of the SiO2 film 112. Contact holes 121H and 122H electrically connected to the Al electrodes 115 and 116 are formed in the protective film 120. Via holes 121V, which are electrically connected to the upper electrodes 119, and via holes 122V, which are electrically connected to the lower electrodes 117, are formed in the protective film 120.

The contact hole 121H and via holes 121V are connected to each other by an outer electrode 121 interposed therebetween. Similarly, the contact hole 122H and via holes 122V are connected to each other with an outer electrode 122 interposed therebetween. The outer electrodes 121 and 122 are both formed on an upper (front) surface of the composite protection element 10. Parts of the outer electrodes 121 and 122 are exposed through apertures AP in the protective film 120. The portions between the via holes 121V and 122V act as an antifuse element. In this way, the antifuse element is configured in a wiring layer on the surface of the Si substrate.

As illustrated in FIG. 5(a), the three antifuse elements are configured between the three via holes 121V and the three via holes 122V, and these elements are connected in parallel. In this way, by forming the fusion portion in each antifuse element so as to have a spot shape, variations in the trigger voltage can be suppressed. By connecting the plurality of antifuse elements in parallel, the on resistance value can be lowered, and the voltage drop in an on state can be reduced.

In the example illustrated in FIGS. 5(a) and 5(b), a single antifuse element portion is configured within a single cross section. A plurality of antifuse element portions (capacitance forming portions) connected in series may be configured. For example, in FIG. 5(b), a layer structure similar to that of the antifuse element portion (capacitance forming portion) composed of the lower electrode 117, upper electrode 119, and insulation layer 118 may also be configured between the via hole 122V and lower electrode 117. The layer structure similar to that of the antifuse element portion (capacitance forming portion) may be stacked between the via hole 121V and upper electrode 119.

Figure 6:
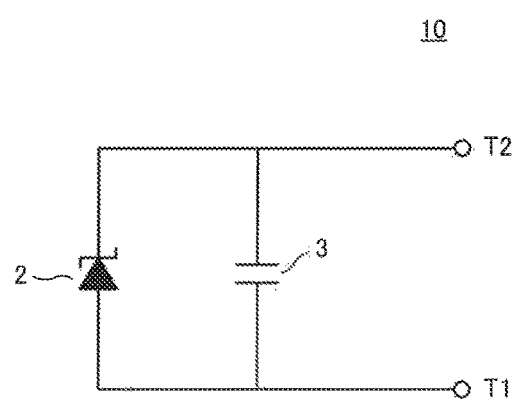
FIG. 6 is a circuit diagram of the composite protection element 10.

FIG. 6 is a circuit diagram of the above-described composite protection element 10. The composite protection element 10 is a parallel circuit of the Zener diode 2 and antifuse element 3. Because the antifuse element has a capacitor structure, it is indicated by a symbol of a capacitor. Two terminals T1 and T2 in the composite protection element 10 correspond to exposed portions in the outer electrodes 121 and 122 illustrated in FIGS. 5(a) and (b).

Figure 7:
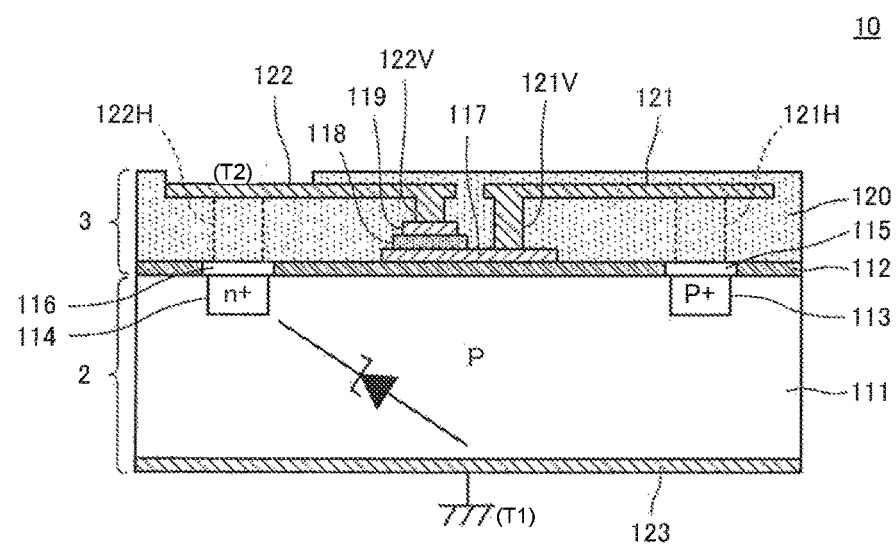
FIG. 7 is a cross-sectional view of a composite protection element 10 having a structure different from that in the composite protection element 10 illustrated in FIG. 5(B).

FIG. 7 is a cross-sectional view of a composite protection element having a structure different from that in the composite protection element 10 illustrated in FIG. 5(b). The composite protection element 10 illustrated in FIG. 5(b) is an element having a horizontal structure including two terminals on the front side of the Si substrate, whereas the composite protection element 10 illustrated in FIG. 7 is an element having a vertical structure including terminals on the front and back sides of the Si substrate. In this composite protection element 10, a back-surface electrode 123 is disposed on the back (rear) surface of the p-type Si substrate 111. The parallel circuit of the Zener diode 2 and antifuse element 3 is configured between the back-surface electrode 123 and outer electrode 122 which is located on the exposed upper (front) surface of the composite protection element 10.

FIGS. 8(a) through 8(d) include schematic cross-sectional views illustrating how the above-described antifuse element changes from an insulation state to a conductive state. In an initial state, the lower electrode 117 and upper electrode 119 are insulated from each other with the insulation layer 118 interposed therebetween.

Figure 8A:
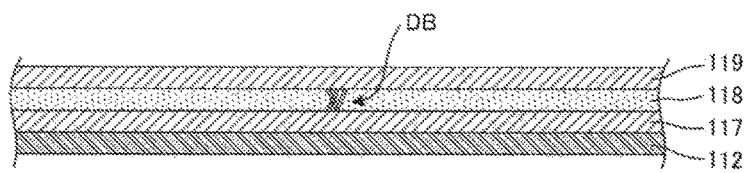
FIGS. 8(a)-8(d) are schematic cross-sectional views illustrating a mechanism of changing from an insulation state to a conductive state in the antifuse element.
Figure 8B:
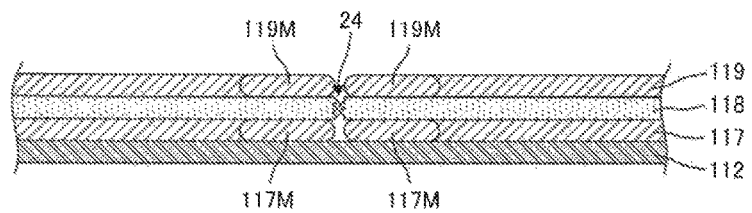

When a voltage at or above the dielectric breakdown voltage of the insulation layer 118 is applied to the antifuse element, as illustrated in FIG. 8(a), a dielectric breakdown occurs in a location DB in the insulation layer 118, and a current caused by the dielectric breakdown (output short current) flows in that portion. This generates heat in the dielectric breakdown location DB, and the heat forms ball portions 119M in the upper electrode 119 and ball portions 117M in the lower electrode 117 in areas adjacent to the dielectric breakdown location DB. The insulation layer 118 is heated by fusion heat in the ball portions 119M and 117M, and a crack 24 appears.

Figure 8C:
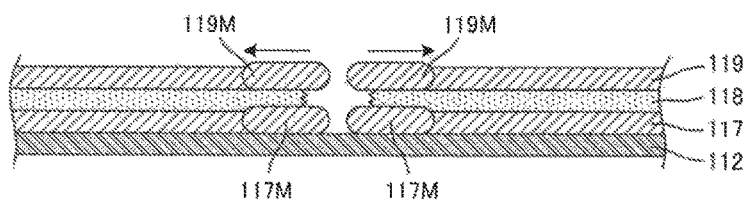

After that, as illustrated in FIG. 8(c), the output short current increases with the progress of the dielectric breakdown, the shorted region is enlarged, the amount of heat generation increases, and thus the ball portions 119M and 117M grow.

Figure 8D:
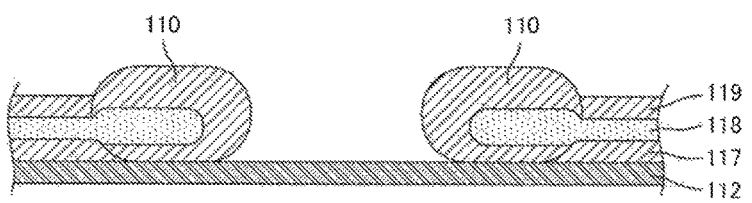

Finally, as illustrated in FIG. 8(d), the enlarged ball portions 119M and 117M are fused together so as to drag the split insulation layer 118 therein, they become integrated to form joint portions 110, and the antifuse element changes to a conductive state. In the conductive state, heat generation caused by shorting is suppressed, the temperature decreases, and the resistance is reduced. After that, a large current flows through the antifuse element.

As illustrated in FIGS. 5(a), (b), and 7, because the Zener diode and antifuse element are configured in a single chip, heat in the Zener diode is conveyed to the antifuse, and antifuse is heated. Accordingly, the antifuse can be further efficiently operated.

Figure 9A:
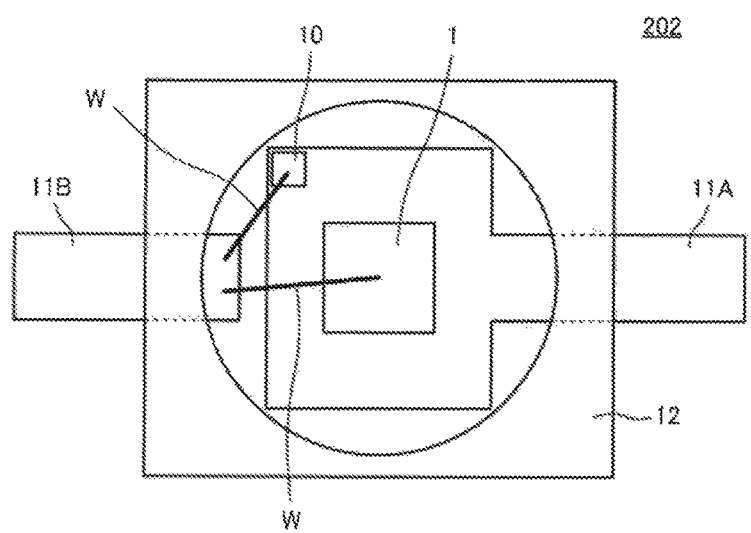
FIG. 9(a) is a plan view of an LED device 202 for illumination according to the second embodiment.
Figure 9B:
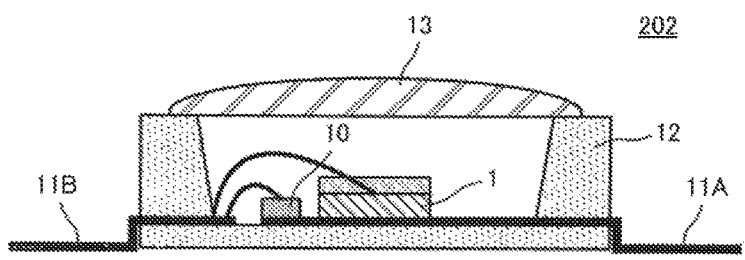
FIG. 9(b) is a cross-sectional view of the LED device 202 for illumination.

FIG. 9(a) is a plan view of an LED device 202 for illumination according to the second embodiment. FIG. 9(b) is a cross-sectional view of the LED device 202. FIG. 9(a) illustrates a state where a cover 13 is removed. The alumina package 12 is integrated with the lead frames 11A and 11B.

In the cavity in the alumina package 12, the LED chip 1 and composite protection element 10 are attached onto the lead frame 11A, preferably by die-bonding. The composite protection element 10 has the vertical structure illustrated in FIG. 7. In the cavity in the alumina package 12, the LED chip 1 is attached to the lead frame 11B by a wire W interposed therebetween by wire-bonding. Similarly, the composite protection element 10 is attached to the lead frame 11B by a wire W interposed therebetween by wire-bonding.

In the case where the composite protection element 10 having the horizontal structure illustrated in FIG. 5(b) is mounted in the alumina package 12, an independent lead frame insulated from the lead frame 11A is prepared, the composite protection element 10 is attached to the independent lead, preferably frame by die-bonding. One of the two wires is connected to the lead frame 11A and the other is connected to the lead frame 11B.

In the case of the composite protection element 10 illustrated in FIG. 7, as illustrated in FIGS. 9(a) and 9(a), because the composite protection element 10 and lead frame 11B are attached together by bonding with only a single wire, there is an advantage in that the number of pieces of wire required can be reduced. The reduction in the number of pieces of wire required results in suppression of a resistance component and parasitic inductance component. Thus a clamp voltage applied to an object to be protected during protection against ESD can be reduced. The resistance in a path when the antifuse element is in a conductive state can be reduced, and conductor loss can be lightened.

The LED chip 1 is, by way of example, a blue light-emitting diode, and a yellow phosphor is applied on the surface of the chip. The transparent cover (lens) 13 is fit on the surface of the alumina package 12.

In this way, the LED device 202 is packaged so as to include the composite protection element.

According to the present embodiment, as illustrated in FIGS. 9(a) and 9(b), because a single composite protection element 10 is used, it is easy to mount the composite protection element 10 in the alumina package 12. In addition, because the antifuse element portion is formed in the wiring layer and thus the thickness of the composite protection element can be reduced, there is an advantage in that light from the LED chip 1 is not blocked by the composite protection element 10.

In the above-described embodiments, examples in which the Zener diode is used as the ESD protection element are illustrated. However, any elements that are made conductive by a predetermined threshold voltage may be used and a similar operational advantage will be obtainable.

Third Embodiment

In a third embodiment, a method for producing a composite protection element to be included in an LED illumination apparatus and a method for mounting the composite protection element on a board are described.

Figure 10A:
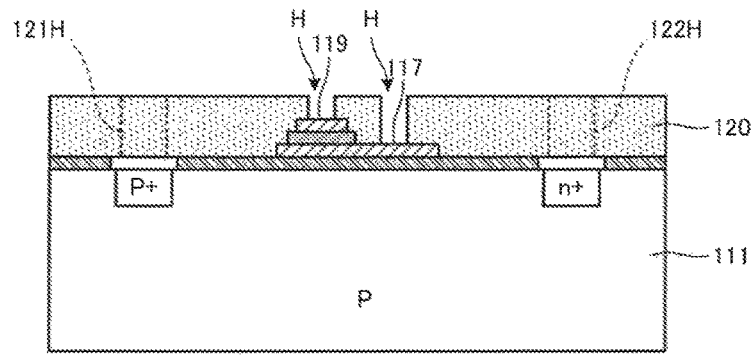
FIGS. 10(a)-10(c) are illustrations illustrating a method for producing the composite protection elements 10 and 100 to be included in an LED illumination apparatus according to a third embodiment.
Figure 10B:
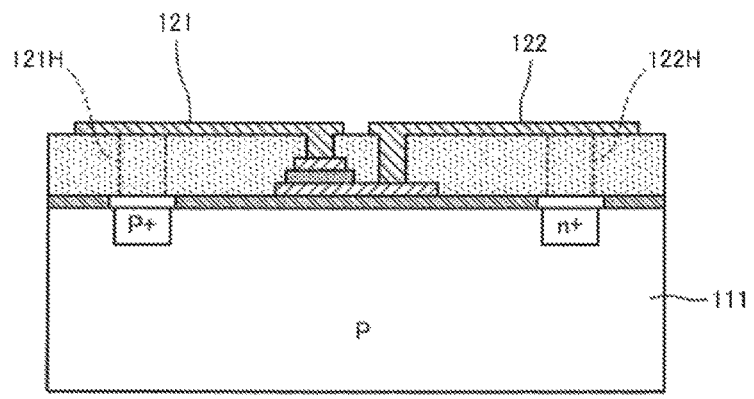
Figure 10C:
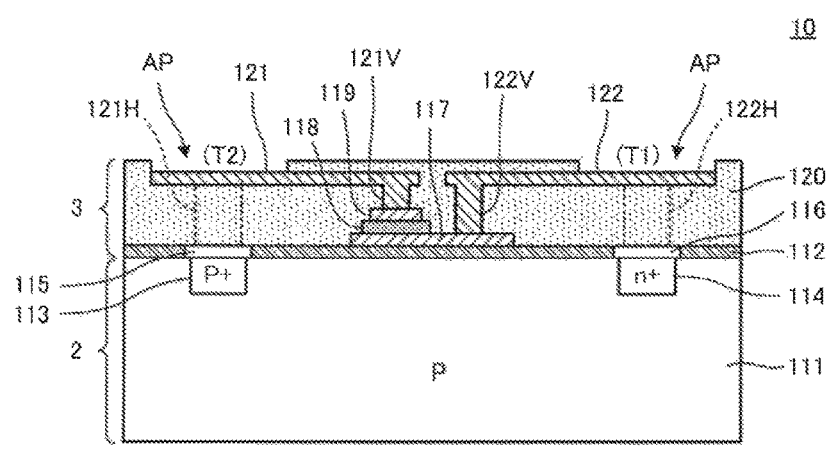

FIGS. 10(a) through 10(c) include illustrations illustrating a method for producing the composite protection elements 10 and 100 to be included in an LED illumination apparatus according to the third embodiment.

FIGS. 10(a), 10(b), and 10(c) are cross-sectional views in the course of the production of the composite protection element. Step in 10(c) corresponds to the composite protection element 10 illustrated in FIG. 5(b). At step in 10(a), the protective film 120 and cavities H are formed. At subsequent step in 10(b), the outer electrodes 121 and 122 are formed. After that, at step in 10(c), the apertures AP are formed, and the composite protection element 10 is configured.

Figure 11A:
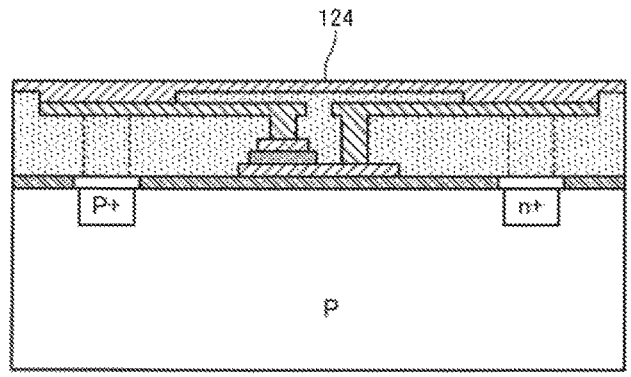
FIGS. 11(a), (b) and (c) are illustrations illustrating the method for producing the composite protection elements 10 and 100 according to the third embodiment and follows FIG. 10.
Figure 11B:
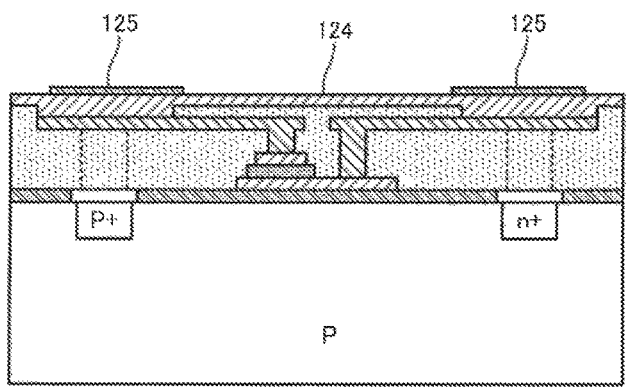
Figure 11C:
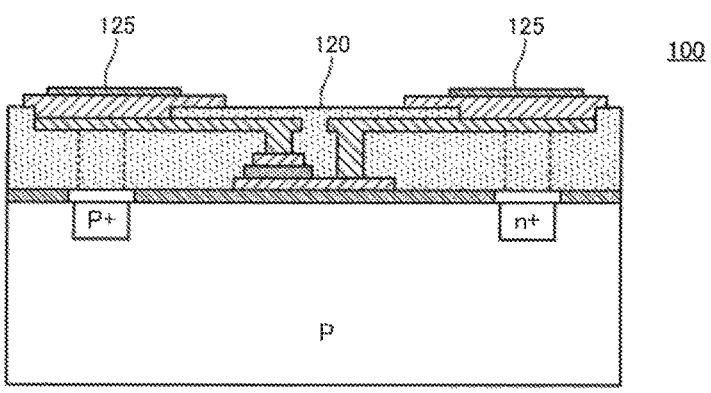

The steps of FIGS. 11(a) through 11(c) follow those of FIGS. 10(a) through 10(c). In FIG. 11(a), a titanium/copper/titanium (Ti/Cu/Ti) film 124 is formed by, for example, sputtering. By way of example, the thickness of the Ti/Cu/Ti film 124 may be 0.1/1.0/0.1 µm. At subsequent step shown in 11(b), outer connection electrodes 125 are formed. By way of example, of each of the outer connection electrodes 125 may be an Au/Sn plating film in which a gold film is formed on a tin film. The total thickness of the Au/Sn plating film 125 may be 10 µm. After that, at the step illustrated in FIG. 11(c), the Ti/Cu/Ti film 124 is patterned. In this way, the composite protection element 100 including the protruding outer connection electrodes 125 is configured.

Figure 12A:
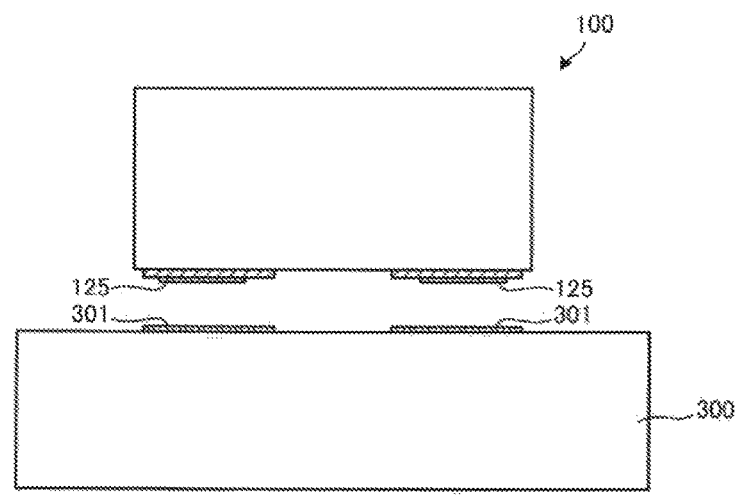
FIGS. 12(a) and (b) are illustrations illustrating the method for producing the LED illumination apparatus according to the third embodiment.
Figure 12B:
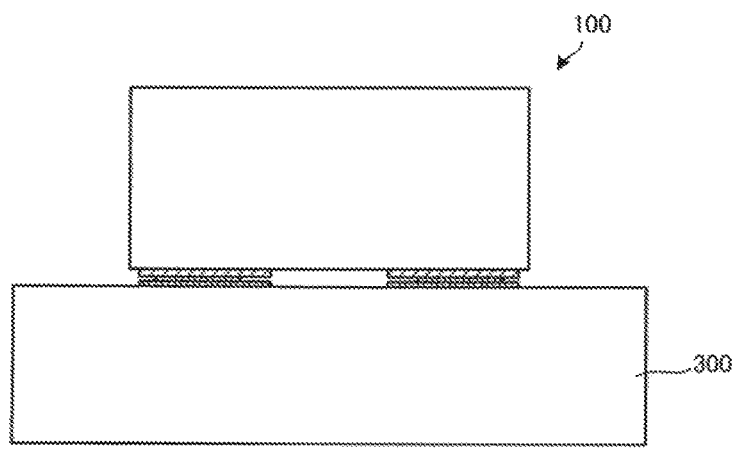

FIGS. 12(a) through 12(b) are illustrations illustrating the method for producing the LED illumination apparatus according to the third embodiment. In particular, FIGS. 12(a) and 12(b) illustrate a state before the above-described composite protection element 100 is mounted on the board 300 and a state after it is mounted thereon, respectively. Lands (surface electrodes) 301 are formed on the board 300. The lands 301 may be the ones in which a nickel and gold plating film is formed on a copper leaf.

As illustrated in FIGS. 12(a) and 12(b), the outer connection electrodes 125 in the composite protection element 100 are preferably heated to about 300° C. and are joined to the lands 301 by a scrubbing technique or ultrasonic joining technique. Thus, a gold and tin solid solution is formed, and they are joined.

Figure 13A:
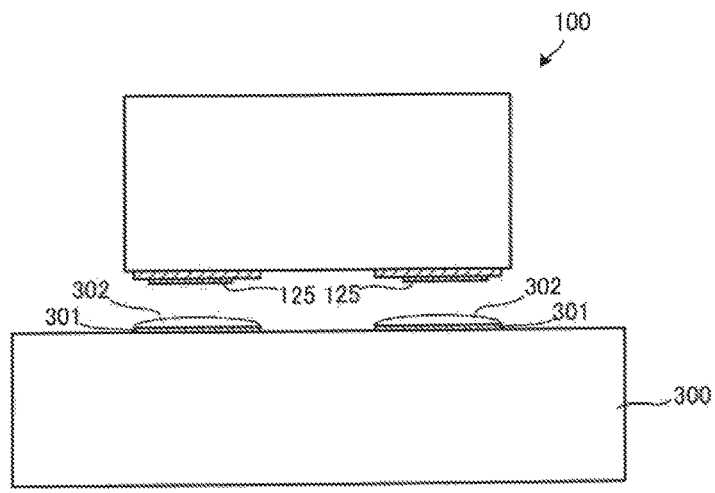
FIGS. 13(a) and (b) are illustrations illustrating another method for producing the LED illumination apparatus according to the third embodiment.
Figure 13B:
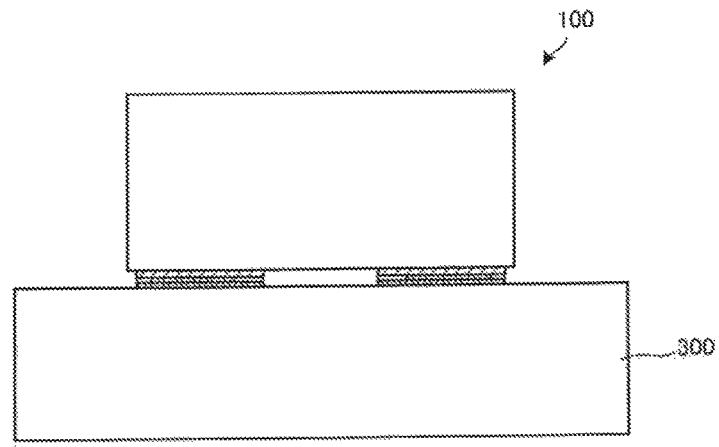
Figure 14A:
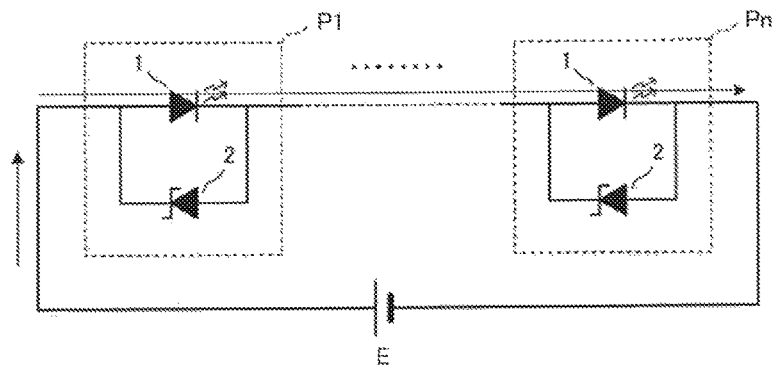
FIGS. 14(a), (b), and (c) are circuit diagrams illustrating example current paths in operation in an LED illumination apparatus using an LED package illustrated in Japanese Unexamined Patent Application Publication No. 2010-212679.
Figure 14B:
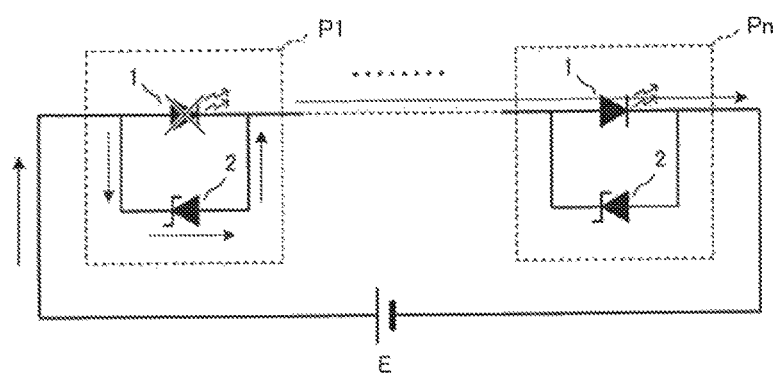
Figure 14C:
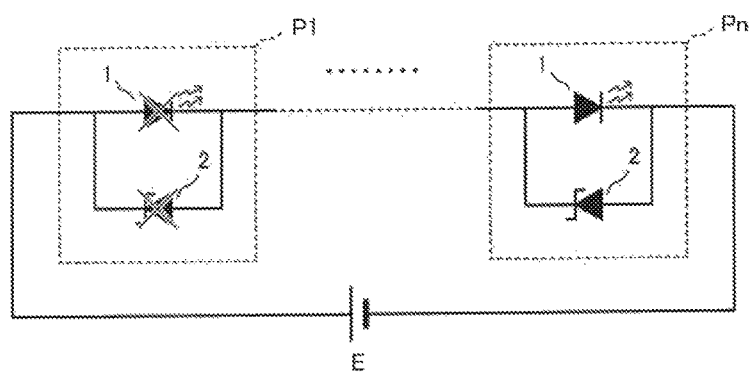

FIGS. 13(a) and 13(b) include illustrations illustrating another method for mounting the above-described composite protection element 100 on the board 300. The lands 301 on the board 300 are preferably ones in which a nickel and gold plating film is formed on a copper leaf. As illustrated in FIG. 13(a), flux 302 is applied to the lands 301. As illustrated in FIG. 13(b), the composite protection element 100 is loaded onto the circuit board 300, they are heated to about 300° C., and thus the composite protection element 100 is mounted without using solder.

According to the present embodiment, an advantage described below is obtainable.

Because the outer connection electrodes 125 protrude with respect to the protective film 120, they can come into contact with the lands on the circuit board 300.

By precoating the outer connection electrodes 125 with gold and tin, they can be joined to the lands on the substrate with the Au/Sn film. This eliminates the necessity to use solder paste.

The invention claimed is:

1. A combination, comprising
a circuit to be protected; and
a composite protection element including a Zener diode connected in parallel to the circuit to be protected and an antifuse element connected in parallel to the Zener diode, the composite protection element is formed on a single chip including a semiconductor substrate having a surface, the Zener diode is formed in the semiconductor substrate and the antifuse element is located on the surface of the semiconductor substrate, the antifuse element having a multilayer structure in which an insulation layer is disposed between electrode layers.

2. The combination of claim 1, wherein the circuit to be protected is an LED chip for illumination.

3. The combination of claim 1, wherein the circuit to be protected is an LED chip for illumination and the composite protection element and the LED chip are housed in a single package.

4. A composite protection element formed on a single chip, the composite protection element comprising:
- a semiconductor substrate;
- a Zener diode formed in the semiconductor substrate; and
- an antifuse element connected in parallel with the Zener diode and is located on a surface of the semiconductor substrate, the antifuse element having a multilayer structure in which an insulation layer is disposed between electrode layers.

5. The composite protection element of claim 4, wherein the composite protection element has a body including opposed front and a rear surfaces and further comprises first and second electrodes located on the front surface, the first and second electrodes being electrically coupled to respective electrode layers of the antifuse element.

6. The composite protection element of claim 4, wherein the composite protection element has a body including opposed front and a rear surfaces and further comprises first and second electrodes located on the front and rear surfaces, respectively, the first and second electrodes being coupled to respective electrode layers of the antifuse element.

7. A combination, comprising:
- a circuit to be protected;
- a lead frame; and
- a composite protection element electrically coupled to the lead frame, the composite element comprising a Zener diode connected in parallel to the circuit to be protected and an antifuse element connected in parallel to the Zener diode, the composite protection element is formed on a single chip including a semiconductor substrate having a surface, the Zener diode is formed in the semiconductor substrate and the antifuse element being located on the surface of the semiconductor substrate, the antifuse element having a multilayer structure in which an insulation layer is disposed between electrode layers.

8. The combination of claim 7, wherein the composite protection element has a body including opposed front and a rear surfaces and further comprises first and second electrodes located on the front and rear surfaces, respectively, the first and second electrodes are coupled to respective electrode layers of the antifuse element.

9. The combination of claim 8, wherein the first electrode is electrically coupled to the lead frame by a single wire and the second electrode is directly coupled to the lead frame without the use of a wire.

10. The composite protection element of claim 1, wherein the composite protection element has a body including opposed front and a rear surfaces and further comprises first and second electrodes located on the front surface, the first and second electrodes being electrically coupled to respective electrode layers of the antifuse element.

11. The composite protection element of claim 10, wherein the composite protection element has a body including opposed front and a rear surfaces and further comprises first and second electrodes located on the front and rear surfaces, respectively, the first and second electrodes being coupled to respective electrode layers of the antifuse element.

12. The combination of claim 1, wherein the antifuse element is formed in a wiring layer.

13. The combination of claim 1, wherein the antifuse element is embedded in a protective film located on the semiconductor substrate.

14. The combination of claim 1, wherein the antifuse element overlaps the Zener diode in plan view.

* * * * *